United States Patent [19]

Long

[11] 3,880,610

[45] Apr. 29, 1975

[54] UNIVERSAL FUNCTION MODULE

[75] Inventor: Lennart E. Long, Waltham, Mass.

[73] Assignee: The United States of America as represented by the Secretary of the Department of Transportation, Washington, D.C.

[22] Filed: Dec. 14, 1973

[21] Appl. No.: 424,853

[52] U.S. Cl. .............. 29/625; 174/68.5; 317/101 B; 317/101 C

[51] Int. Cl. ............................................ H05k 3/00

[58] Field of Search ............. 29/624, 625; 174/68.5; 317/101 B, 101 C

[56] References Cited

UNITED STATES PATENTS

| | | | |
|---|---|---|---|
| 3,240,999 | 3/1966 | Sands | 174/68.5 X |
| 3,364,300 | 1/1968 | Bradham | 29/625 X |
| 3,485,934 | 12/1969 | Prather | 29/625 X |
| 3,491,197 | 1/1970 | Walkow | 29/625 X |
| 3,496,419 | 2/1970 | Sakellakis | 174/68.5 X |
| 3,538,389 | 11/1970 | Leuesque et al. | 29/625 X |
| 3,564,114 | 2/1971 | Blinder | 174/68.5 |
| 3,621,116 | 11/1971 | Adams | 29/625 X |

*Primary Examiner*—C. W. Lanham
*Assistant Examiner*—Joseph A. Walkowski
*Attorney, Agent, or Firm*—Herbert E. Farmer; Harold P. Deeley, Jr.

[57] ABSTRACT

A method of fabricating universal circuit boards which can be utilized in making up the most common circuit elements, such as amplifiers and the like, to be in turn combined to make up any number of customed design electronic devices. The universal printed circuit board disclosed has numerous paths which can be alternately utilized to provide a combination of many possible circuits. This board can then be used with other similarly designed boards to fabricate complete custom-designed electronic equipment.

4 Claims, 7 Drawing Figures

UNIVERSAL FUNCTION MODULE

ORIGIN OF THE INVENTION

The invention described herein was made by an employee of the U.S. Government and may be manufactured and used by or for the Government for governmental purposes without payment of any royalties thereon or therefor.

BACKGROUND OF THE INVENTION

This invention relates to circuit boards which are used to make up electronic devices. That is, the circuit boards are printed circuits and components are soldered or affixed to the circuit board in various configurations to make up a given circuit such as an amplifier, a modulator, detector, and so forth. These circuit boards are then installed in devices which are designed to receive several circuit boards which thereby interrelate or interreact in such a manner that an entire electronic device, such as a small or large analog or hybrid computer or other electronic devices which are unlimited in possible numbers and combinations.

With the ever increasing numbers of specilized analog devices and equipment that are needed to fulfill various technological missions such as the detection of pollutants in gases, the processing of data from various communication sources, and any number of devices for the control of machinery and other equipment, have resulted in an ever increasing simplification of the various circuits which ultimately make up a completed device. It was early seen that if a circuit board could be fabricated in such a manner that they were not unique to a given circuit great economies could be made. Nevertheless, for numerous years the only efficient manner in which a circuit board could be fabricated for a particular design was the laying out of that circuit by a draftsman and then having the various wire interconnections photoetched and electrodeposited onto a circuit board whereby the "printed circuit" was thereby developed. The nature of the industry became such that short circuit board design runs were made as well as the more efficient large circuit board runs for mass produced devices. Even with the short design runs considerable time and energy is expended in making the circuit. Unfortunately, as most often happens, in the first and second generations of a given device, it is found that the circuit designed does not perform as anticipated and modifications of the circuit are necessary. It then necessitates the designing of another circuit board which is again photoetched and the various processes reencountered increasing the cost of the design of the product and its development.

Numerous schemes have been proposed to obviate the expense and waste of time developing a circuit board which could be used for any kind of circuit. An off the shelf piece of circuit board could be predrilled and preprinted in such a way that a configuration of circuit components could be soldered to the circuit board thereby presenting a unique circuit for any device. Another section of circuit board could then be soldered with different components which would then bring about another circuit also unique which could work in conjunction with the above circuit. The above process continuing until a fully functioning electronic device for some given purpose were fabricated. The prior art devices universally attempted to make circuit boards with crosshatched wiring schemes above and below the circuit board predrilled with interconnections between the various circuits when a component was placed on it. The attempt was a total universal application which is deemed to be a failure. For example the long wire runs on such a board can produce vibration failure modes. The present inventor recognized this shortcoming and attempted to develop a limited universal circuit board.

This inventor discovered further that certain basic similarities exist in any number of common circuits. Exploiting these symmetries he was able to work out a board which provided all of the universality necessary to provide a circuit board which can be off the shelf and accommodate a significant variety of components which will provide an inventory of circuits for the designer which will enable him ultimately to fabricate all of the devices he may need in the functioning of his design and development operation.

SUMMARY OF THE INVENTION

This invention is characterized by a printed circuit board having numerous paths which may be alternately utilized for different circuits whereby a combination of possible circuits may be fabricated on a given board for incorporation with other similarly designed circuit boards ultimately being utilized as a working device. The circuits that can be alternatively fabricated on this universal board are all the usual encountered circuits the designer will need in the fabrication and development of various electronic devices.

Therefore, an object of the present invention is to develop a limited universal printed circuit board. Another object of the present invention is to provide a method of designing printed circuits which can be utilized for a large number of useful electronic circuits. Another object of the present invention is to provide a method whereby design, expense and time can be best utilized in the fabrication of custom designed electronic equipments.

DESCRIPTION OF THE PREFERRED EMBODIMENTS

Figure 1A:
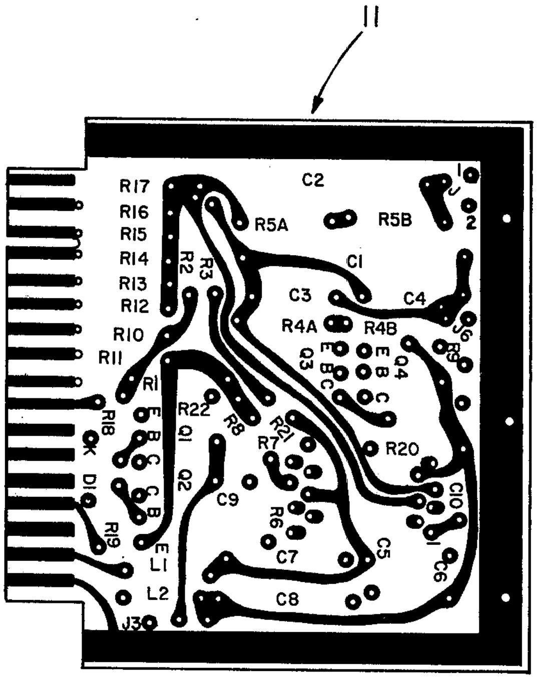
FIG. 1*a* illustrates the top side and FIG. 1*b* the bottom side, respectively, of a universal circuit board in accordance with the present invention.
Figure 1B:
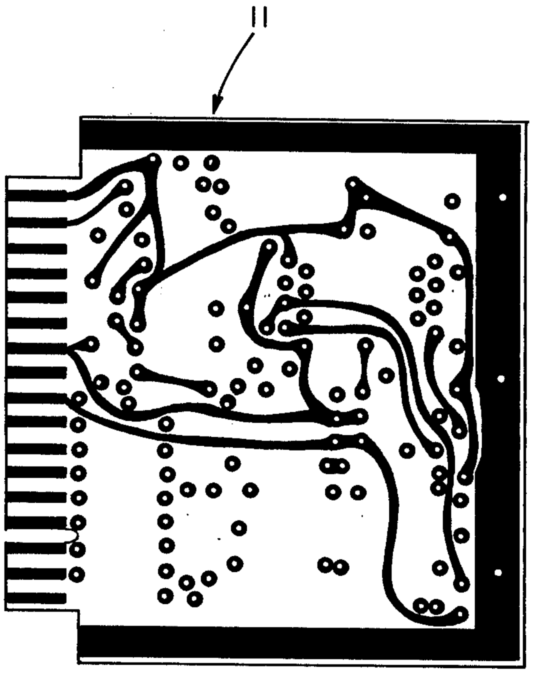

FIGS. 1*a* and 1*b* illustrate the top and bottom sides, respectively, of a universal circuit board 11. This circuit board is a production circuit board. That is the usual process of laying the circuit configuration out by a draftsman the photoprocessing and ultimate etching and production of this circuit on a substrate of insulating material for production line products is utilized. They, therefore, can be placed on the shelf for utilization by designers and engineers in their fabricating of electronic equipments. This circuit board, like the standard circuit boards, has interconnects which are selected by the designer in interconnecting to the various components he wishes to hook up. We see the circuit board having various designations as resistors R 17 and so forth. These various numbered items indicate the connection of a component to the engineer.

Figure 3:
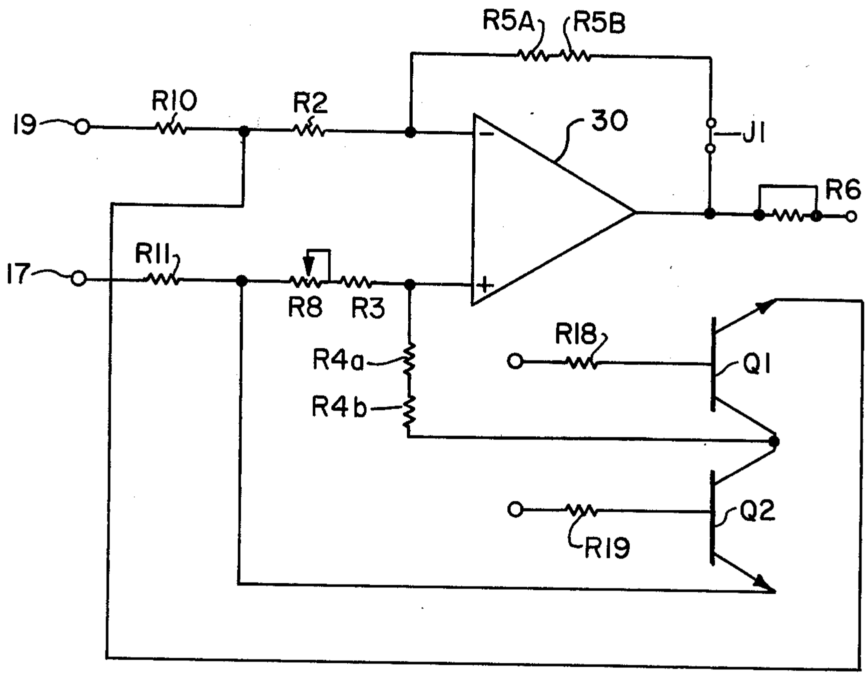
FIG. 3 is a synchronous demodulator circuit.
Figure 2:
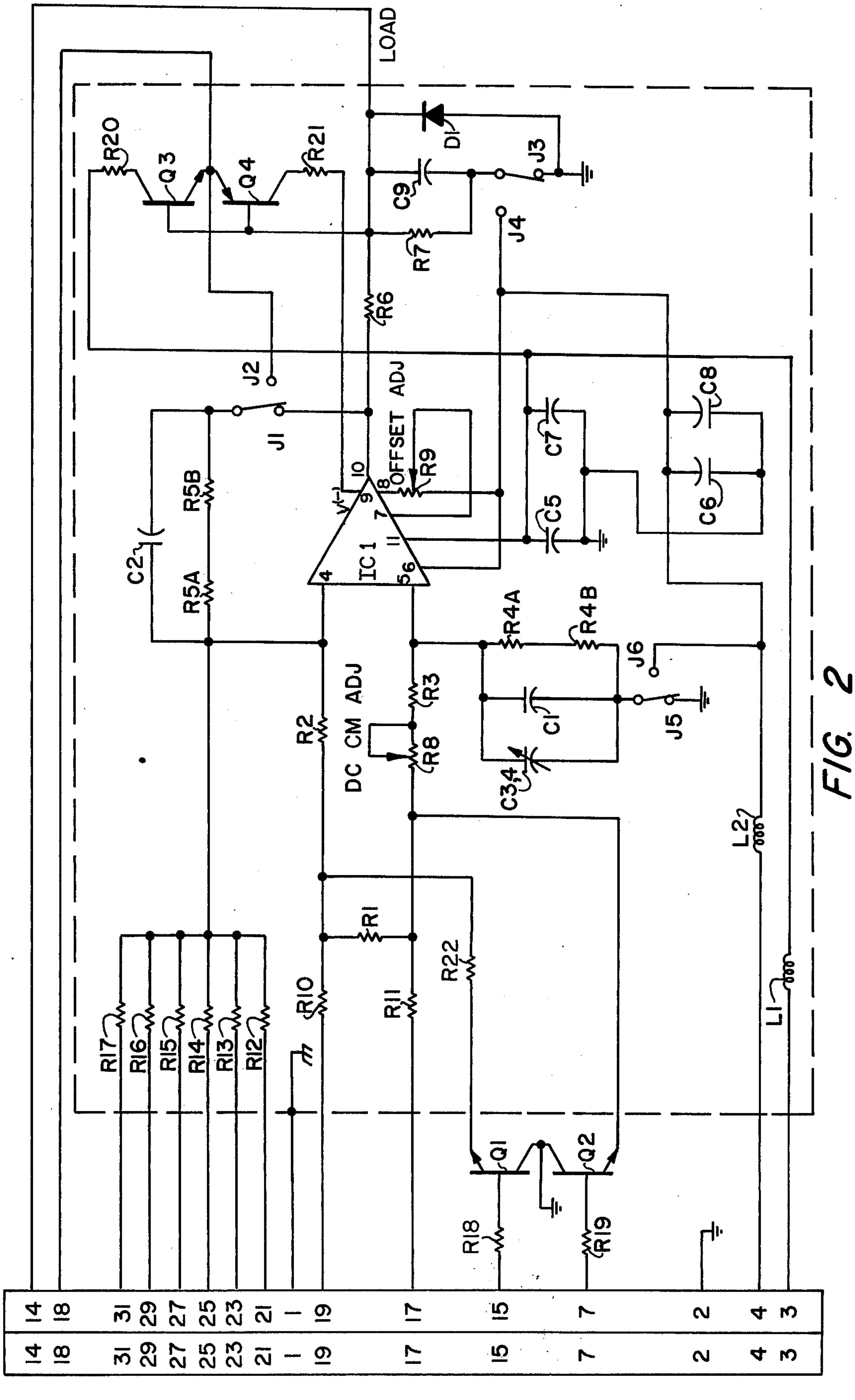
FIG. 2 is a universal circuit board connection to components which make up numerous desirable and useful circuits.
Figure 4:
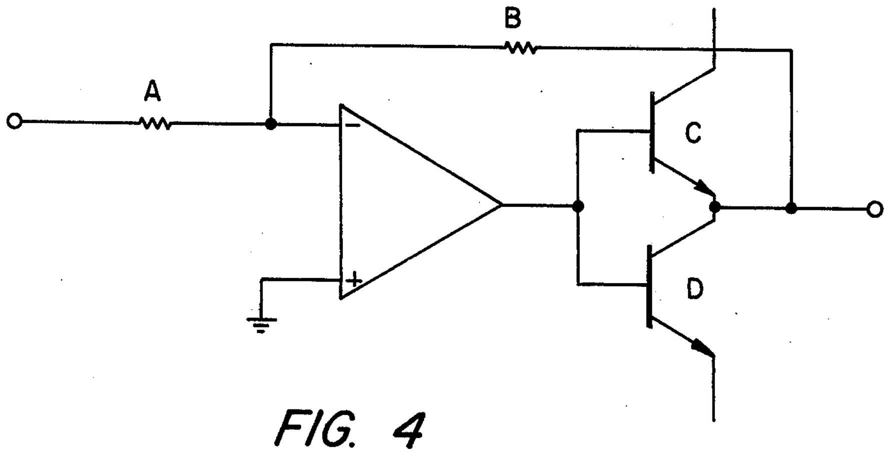
FIG. 4 is a power amplifier.
Figure 5:
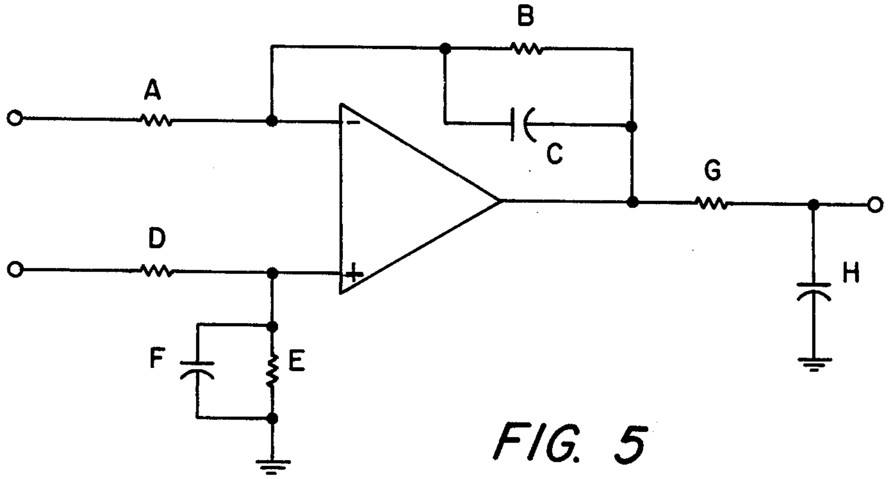
FIG. 5 is a double pole filter.

The engineer, therefore, can select this circuit board and pick out a variety of components which will make up a given circuit such as a power amplifier, interconnect at appropriate points and will then have a completed circuit. The underside of this board FIG. 1A shows a variety of additional interconnections which complete the circuit on the top side where required. The same process of layout and etching is utilized. Referring now to FIG. 2, we see a layout of components wherein different items are enumerated which correspond to the circuit interconnections of the universal board. The various components are selected to correspond to a given device or specific circuit, such as an amplifier and so forth. The values of each component R 17, C 2 and so forth, will be selected in accordance with the given circuits requirements. To accomplish this, the inventor took a significant number of circuits that would be useful in making up various electronic equipment. He superimposed each circuit, one on top of each other, taking into account the various symmetries that each of them offered. He was thereby able to select the circuits that he knew would be useful in advance. A significant number of circuits having been selected which could be utilized in the fabrication of any given device enabled the inventor to develop and layout the circuit of FIG. 2 which really is a nothing circuit. The individual components once in place for a selected circuit will enable the fabrication of that circuit and the functioning of that circuit once these components are soldered into place. There are a location of some jumpers to complete certain circuits and they are indicated as J 1, J 2, J 3 and J 4. However, this judicious selection of components and their affixing to the circuit enables one to fabricate a given circuit for a select purpose in advance and the utilization of this circuit arrangement to provide a functioning block in a designer's scheme for the development and ultimate fabrication of a useful electronic device. Referring now to FIG. 3, we see a synchronous demodulator. This circuit by the selection of values for R 10, R 2, R 5A and R 5B along with J 1 jumpered, R 6 a short circuit and the substitution of R 11, R 8, R 3, R 4A, R 4B, R 18, R 19, R 6, Q 1 and Q 2 would develop a synchronous demodulator around operational amplifier 30. Similarly FIG. 4 is a power amplifier about operational amplifier 30 and FIG. 5 is a double pole filter. And again in FIG. 6 we see a low noise microvolt signal conditioner. The passive shield having been installed about the entire circuit board provides the protection needed for this circuit.

A long list of circuits could be enumerated here which have been designed, their components selected and installed onto this universal circuit board thereby providing a functioning circuit, be it amplifier, demodulator, or what have you, permitting the engineer to quickly put together a circuit on a printed circuit board by the selection of a variety of components, all "off the shelf" items.

Once the designer has fabricated a given circuit on a circuit board, he combines this with other circuits on similar circuit boards, again all off-the-shelf, and having identical circuit boards prior to the fabrication of the circuit thereon. These circuit boards then can be combined to make up a device. If the device fails to function or operate as anticipated the components can be removed and modified. Therefore, as indicated above, the engineer after he has designed a completed device and it does not respond or function as he anticipated, can remove certain components from a given circuit to alter the performance or can rework the circuit and substitute additional circuits in place of earlier designs thereby providing the means to enable him to select and modify circuits for installation on circuit boards without having to go through the ordeal and expense of producing even limited runs of customized circuit boards in the fabrication of electronic equipment.

Figure 6:
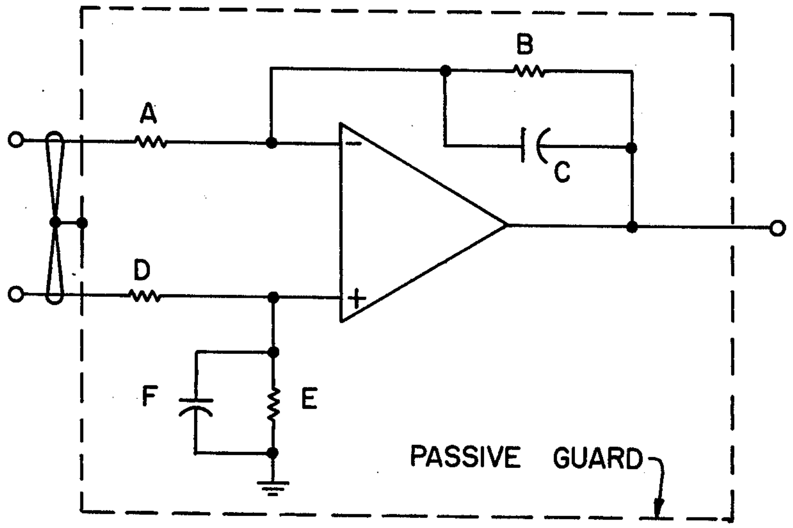
FIG. 6 is a low noise microvolt signal conditioner.

SOME ADDITIONAL POSSIBLE CIRCUIT CONFIGURATIONS ARE:

Non-inverting adder
Non-inverting subtractor
Non-inverting adder/subtractor
Difference integrator
Differentiator
Summing integrator
Augmenting integrator
Lag network
Current-to-voltage transducer
Peak reader & memory
Compressor
Differential amplifier
Phono/AC amplifier
High input impedance non-inverting amplifier
Unity gain follower
Unity gain inverter
Emitter follower booster
Inverting adder
Single input integrator
Log of ratio
Bistable multivibrator
Log amp (diode or transistor element)
Free-running multivibrator
Monostable multivibrator
Level shifter The described circuits of FIGS. 4, 5 and 6 may have the following elements substituted to produce functioning circuits in the Table below.

TABLE

| Name of Circuit | Part No. | UM Part Equivalent | Remarks |
|---|---|---|---|
| Power Amplifier (FIG. 4) | A | R10 + R2 | J2 jumpered |
| | B | R5a + R5b | R6 = OΩ |
| | C | Q3 | |
| | D | Q4 | |
| Double Pole Filter (FIG. 5) | A | R10 + R2 | J1, J3, J5 Jumpered |
| | B | R5a + R5b | |
| | C | C2 | |
| | D | R11 + R8 + R3 | |
| | E | R4a + R4b | |
| | F | C1 + C3 + C4 | |
| | G | R6 | |
| | H | C9 | |

TABLE – Continued

| Name of Circuit | Part No. | UM Part Equivalent | Remarks |
|---|---|---|---|
| Low Noise Microvolt Signal Conditioner FIG. 6 | A | R10 + R2 | J1, J5 Jumpered |
| | B | R5a + R5b | R6 = OΩ |
| | C | C2 | |
| | D | R11 + R8 + R3 | |
| | E | R4a + R4b | |
| | F | C1 + C3 + C4 | |

I claim:

1. The method of fabricating a universal circuit board comprising the steps of:

selecting a group of common essential circuit configurations, arranging said circuits to develop maximum symmetry between circuits, drawing a circuit layout corresponding to all of said circuits, preparing a circuit board in accordance with said layout.

2. The method of fabricating said universal circuit board according to claim one which further includes the step of shielding said circuit board to accommodate sensitive circuits.

3. The method of fabricating said universal circuit board according to claim two which further includes the step of labeling the location of required circuit components making up the various circuits.

4. The method of fabricating said universal circuit board according to claim three which further includes the step of reducing the essential common circuits to a list of required component connections corresponding to said labeled circuit board.

* * * * *